United States Patent [19]
Cornacchia

[11] 3,952,252
[45] Apr. 20, 1976

[54] NOISE SUPPRESSOR FOR TELECOMMUNICATION SYSTEM

[75] Inventor: Carlo Cornacchia, Milan, Italy

[73] Assignee: Societa Italiana Telecomunicazioni Siemens S.p.A., Milan, Italy

[22] Filed: Jan. 30, 1974

[21] Appl. No.: 437,887

[30] Foreign Application Priority Data
Jan. 30, 1973 Italy .................. 19733/73

[52] U.S. Cl. ................. 325/319; 307/237; 325/411; 325/474; 325/478; 328/165
[51] Int. Cl.² ........................................ H04B 15/00
[58] Field of Search ........... 325/319, 402, 403, 408, 325/409, 411, 414, 415, 473, 478, 474, 480, 482; 307/237, 239; 328/171, 169, 168, 151, 165

[56] References Cited
UNITED STATES PATENTS

| | | | |
|---|---|---|---|
| 2,493,045 | 1/1950 | Toth | 325/482 |
| 2,710,347 | 6/1955 | Brady | 328/171 |
| 3,339,144 | 8/1967 | Squires | 325/478 |
| 3,613,012 | 10/1971 | Feistel | 325/474 |

Primary Examiner—Robert L. Griffin
Assistant Examiner—Marc E. Bookbinder
Attorney, Agent, or Firm—Karl F. Ross; Herbert Dubno

[57] ABSTRACT

A detector stage at a receiving station of a telecommunication system derives from an incoming modulated carrier a constant reference voltage lower than the minimum amplitude of the detected modulation signals which are fed to the base of an NPN transistor whose emitter receives the reference voltage through a resistor. The collector of the transistor, cut off from any direct-current supply, is coupled to a subsequent audio stage through a series capacitor and to ground through a shunt capacitor. Normally, the transistor is saturated and its emitter potential, closely following its base voltage, is practically duplicated on its collector. In the presence of large static, however, the noise pulses cut off the transistor as the shunt capacitor temporarily stores the magnitude of the immediately preceding signal amplitude.

10 Claims, 3 Drawing Figures

NOISE SUPPRESSOR FOR TELECOMMUNICATION SYSTEM

FIELD OF THE INVENTION

My present invention relates to a noise suppressor for a receiving station in a telecommunication system, such as an a-m radio receiver, in which received unipolar low-frequency signals are subject to distortion by superimposed noise pulses.

BACKGROUND OF THE INVENTION

Especially in systems using carrier-wave transmission via radio links, atmospheric static frequently produces broad-spectrum interference resulting in unpleasant crackling in a loudspeaker or annoying streaks on a viewing screen. Noise pulses can also be generated by unshielded electric equipment operating nearby.

The suppression of such noise pulses, particularly in a-m radio reception, has heretofore been accomplished somewhat imperfectly by simple amplitude limitation and more thoroughly with relatively complex and costly circuitry including differentiation and integration networks.

OBJECTS OF THE INVENTION

The object of my present invention, therefore, is to provide simple yet effective means in a signal channel, particularly in the audio stage of an a-m radio receiver, for the suppression of large-amplitude pulses superimposed upon a useful low-frequency signal.

SUMMARY OF THE INVENTION

This object is realized, in accordance with my present invention, by the provision of a transistor having its base and its emitter connected to respective terminals receiving a first and a second biasing voltage from a source of direct current, the relative polarities of these biasing voltages being such that the transistor normally carries base current and saturates. The base also receives the incoming low-frequency signals. The emitter is connected to its biasing terminal through a resistor so that its voltage normally follows the base voltage which also receives the incoming low-frequency signals. The transistor has a floating collector, cut off from the d-c biasing source, which is capacitively coupled to an output terminal leading to a load such as an audio stage of a radio receiver. Because of the saturation, the impedance between the emitter and the collector is normally very low so that only a small voltage drop exists thereacross. The received signals are of such a polarity (negative in the case of an NPN transistor) as to reduce the difference between the two biasing voltages without, however, desaturating the transistor as long as the signal amplitude stays below a predetermined limit.

As long as the transistor is saturated, its collector potential closely approximates its emitter potential which in turn follows the applied base voltage; thus, the collector faithfully reproduces the incoming signals. If, however, the signals are accompanied by a sharp noise pulse whose amplitude substantially exceeds the maximum signal amplitude to be received by the load, the transistor is cut off so that the pulse is not transmitted to its collector.

Advantageously, according to another feature of my invention, the floating collector is capacitively shunted to a common input and output terminal of constant potential (usually ground) so that during cutoff the collector voltage substantially remains at the instantaneous level at which it was just before the arrival of the noise pulse. Upon termination of the interference, therefore, the signal returns to its previous amplitude within its normal range and instantly regains its low-frequency waveform. The voltage of the load, capacitively coupled to the collector, also remains substantially unchanged during cutoff.

In case the incoming low-frequency signals are obtained by detection of the envelope of an amplitude-modulated carrier, the biasing and reference voltages can be derived directly from a detector stage in which that carrier is demodulated in the well-known manner. In that instance the detector may comprise a capacitively shunted voltage divider in series with the biasing source, a tap of this divider being connected to the emitter of the noise-suppressing transistor. Another point of the divider, advantageously located about midway between the aforementioned tap and a diode in series with both the capacitive and resistive branches of the detector stage, may then be used to supply a comparison voltage to one input of a differential amplifier having another input connected to the transistor emitter, this amplifier serving for automatic gain control.

BRIEF DESCRIPTION OF THE DRAWING

The above and other features of my invention will now be described in detail with reference to the accompanying drawing in which.

SPECIFIC DESCRIPTION

Figure 1:
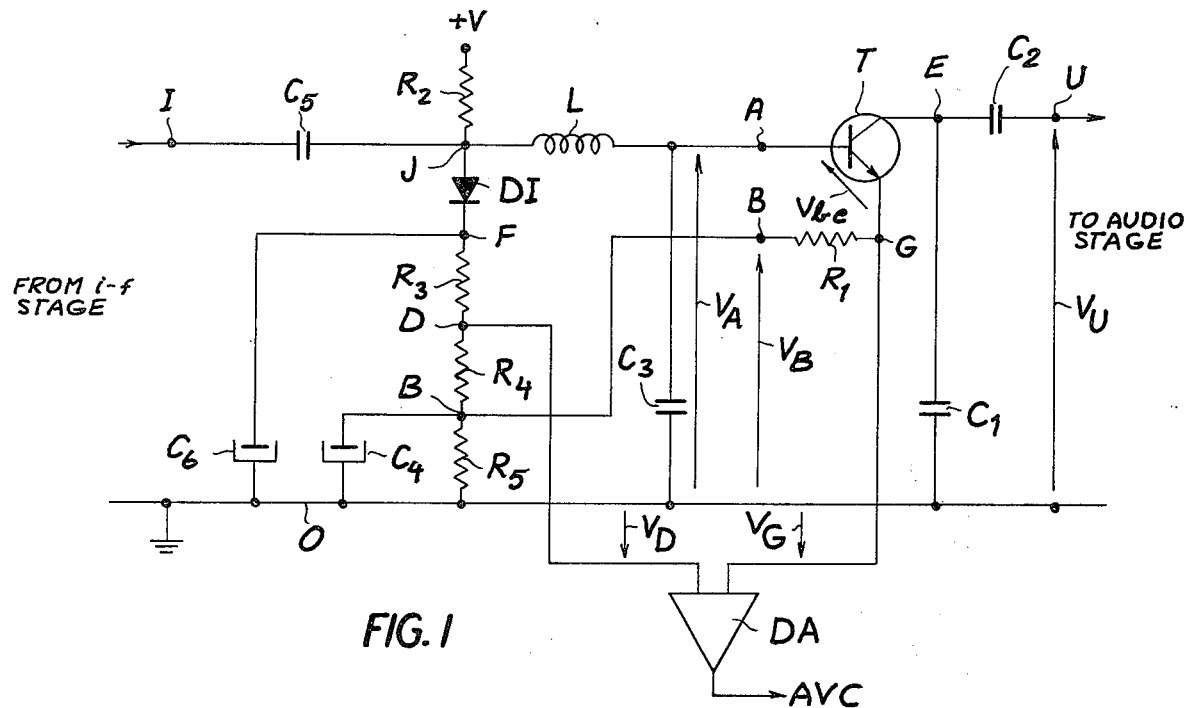
FIG. 1 is a circuit diagram illustrating a noise suppressor according to my invention.
Figure 2:
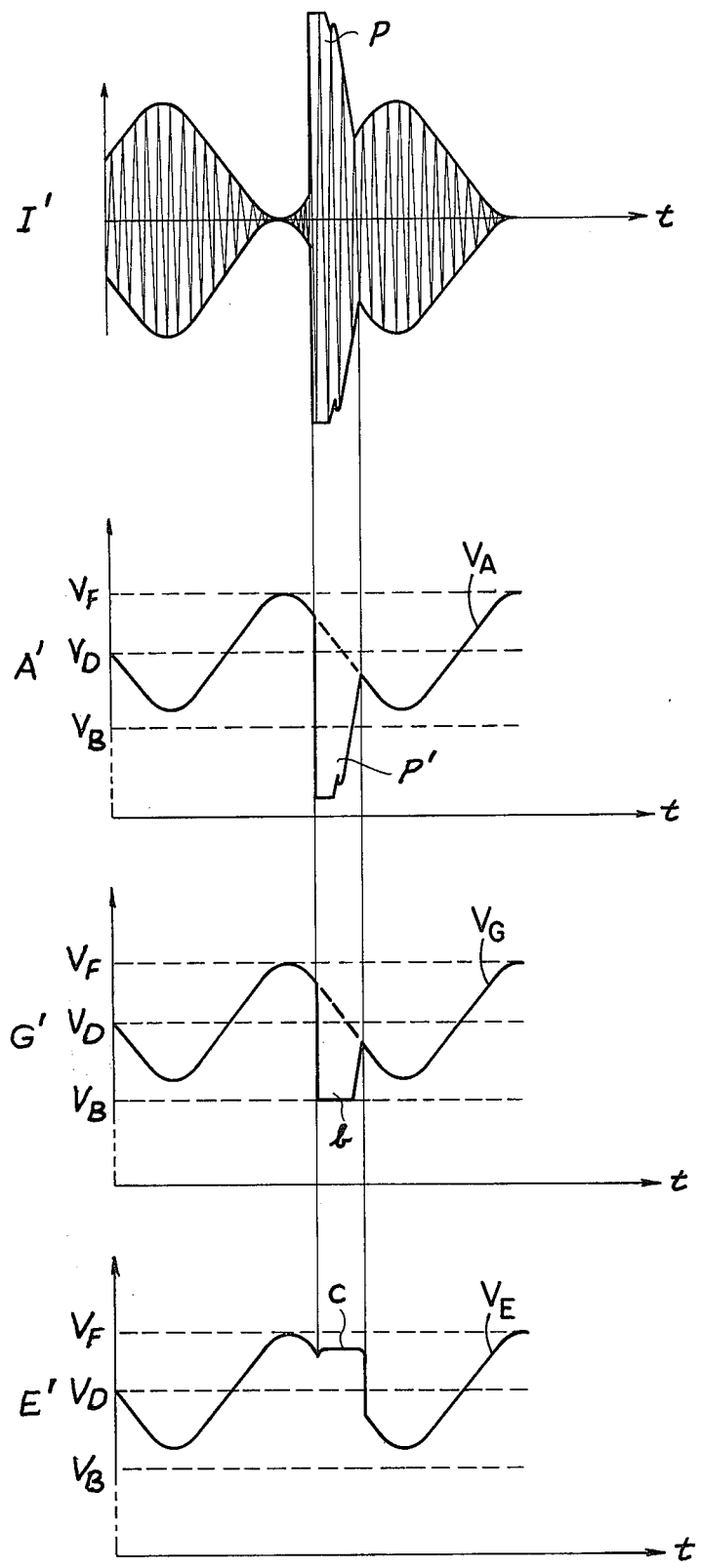
FIG. 2 is a set of graphs serving to explain the mode of operation of my improved noise suppressor.

In FIG. 1 I have shown part of a receiving station for amplitude-modulated carrier waves, specifically a detector stage inserted between an intermediate-frequency stage and an audio stage. The illustrated system comprises a grounded bus bar O and an input terminal I between which an amplitude-modulated carrier, as illustrated at I' in FIG. 2, is received from the preceding i-f stage. The carrier passes a coupling condenser $C_5$ and is demodulated in a detector circuit comprising a series inductance L which forms part of a low-pass filter also including a shunt condenser $C_3$. The junction J of capacitor $C_5$ and inductance L is positively biased, via a resistor $R_2$, from a source of constant voltage +V. Junction J, separated by inductance L from a point A carrying only the low-frequency component of the input voltage, is connected to ground on bus bar O through a diode DI in series with a voltage divider including three resistors $R_3$, $R_4$ and $R_5$; the voltage divider is shunted by a capacitor $C_6$. Two taps on the voltage divider have been designated B (between resistors $R_4$ and $R_5$) and D (between resistors $R_3$ and $R_4$); the common junction of resistor $R_3$ with capacitor $C_6$ and the cathode of diode DI has been labeled F. Bus bar O, point A and tap B may be considered terminals of the rectification network DI, $R_3 - R_5$ and $C_6$ forming part of the illustrated detector stage. Resistor $R_5$ is bridged by a further capacitor $C_4$ designed to bypass a-c components from terminal B to ground.

Terminal A is tied to the base of an NPN transistor T whose emitter is connected to a point G energized from tap B through a resistor $R_1$. A point E, tied to the collector of transistor T, is shunted through a capacitor $C_1$ to grounded bus bar O, i.e. to the first terminal of the detector stage common to its input and output sides; point E is also coupled through a capacitor $C_2$ to a fourth terminal U leading to the audio stage, an output voltage $V_U$ being developed between terminals U and O.

A comparator in the form of a differential amplifier DA has two inputs respectively connected to points D and G. This amplifier forms part of a conventional gain-control circuit not further illustrated.

The polarity of the direct-current supply +V, O is such that, as long as junction J is more positive than point B, a current saturating the noise-suppressing transistor T flows through resistor $R_2$, inductance L, the base/emitter path of transistor T, and resistors $R_1$ and $R_5$. Points F, D and B are maintained at substantially constant potentials $V_F$, $V_D$ and $V_B$, as shown in FIG. 2, by shunt capacitors $C_4$ and $C_6$. In the presence of an incoming amplitude-modulated carrier, junction J is driven negative with respect to point F so that the base voltage $V_A$ (at point A) and the emitter voltage $V_G$ (at point G) normally range between levels $V_F$ and $V_B$, as seen in graphs A' and G' of FIG. 2, these voltages differing by the small voltage drop $V_{be}$ indicated in FIG. 1. The voltage $V_E$ of the floating collector of the transistor, developed at point E, substantially duplicates the emitter voltage as illustrated in graph E' of FIG. 2.

If, however, a noise pulse P appears at the input I as shown in graph I' of FIG. 2, the transistor base is driven more negative than the threshold $V_B$ as shown at P' in graph A'. This cuts off the transistor T so that its collector terminal E is virtually insulated from base terminal A; with capacitor $C_1$ still charged to the voltage level last registered at terminal E, the collector voltage remains constant until the pulse P disappears. This has been illustrated at c in graph E' of FIG. 2 which also shows that, upon resumption of normal operation, the collector promptly regains the voltage level it would have had if the pulse had not interfered. During the cutoff, emitter terminal G is at voltage $V_B$ as indicated at b in graph G'.

Thus, the appearance of large-amplitude pulses results only in a minor distortion of the useful signal even if the peak amplitude of the latter varies within wide limits.

With resistors $R_3$ and $R_4$ approximately equal to each other, point D lies electrically about midway between points B and F so that its potential $V_D$ is approximately the mean of potentials $V_B$ and $V_F$ as shown in FIG. 2. Taking into account the small voltage drop (neglected in FIG. 2) across diode DI in the absence of modulation and the corresponding voltage drop $V_{be}$ in the input circuit of transistor T, potential $V_D$ can be chosen to coincide with the median of the voltage swing shown in graphs A', G' and E' to serve as a basis of comparison for the signal voltage $V_G$ at point G as these two voltages are used to drive the differential amplifier DA. Thus, amplifier DA emits a low-frequency voltage AVC which, after rectification, can be used for automatic volume control, in a manner known per se, for the partly illustrated receiver whose input stage is the i–f stage connected across terminals I and O and whose output stage is the audio stage connected across terminals O and U. Since the two voltage drops across diode DI and in the transistor input are of substantially the same magnitude and subject to the same variations with temperature, the operation of comparator DA is thermally stable.

Though FIG. 2 represents the case of 100 percent carrier modulation, it will be apparent that the system will also work with lower modulation indices.

Figure 3:
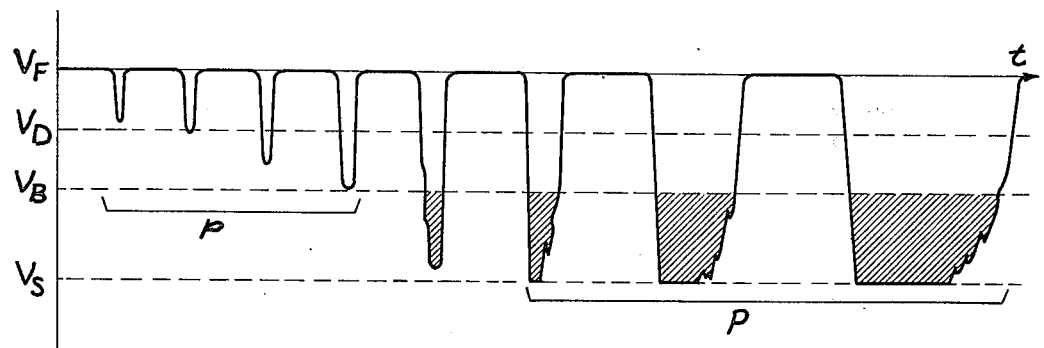
FIG. 3 is a similar graph illustrating the effect of the suppressor upon noise pulses of different amplitudes superimposed upon a received low-frequency signal.

In FIG. 3 I have shown a series of detected noise pulses of different amplitudes and widths, ranging from less than half a maximum signal amplitude ($V_F - V_D$) to the saturation level $V_S$ of the preceding i–f stage. The smaller and generally narrower pulses p pass through the suppressor but can be largely eliminated by conventional filters in the downstream audio stage; the larger pulses P, however, are suppressed as described above with reference to FIG. 2.

Obviously, condenser $C_1$ should be of relatively low capacitance so as not to attenuate unduly the useful low-frequency signals. On the other hand, condenser $C_2$ serves merely as a coupler and d-c blocker so that its capacitance may be relatively high.

I claim:

1. A noise suppressor for a telecommunication system, comprising:
    a receiver having an input circuit for an incoming carrier modulated in amplitude by useful signal pulses and accompanying noise pulses, said receiver also having an output circuit;
    a source of direct current;
    rectifying circuit means connected across said source and forming a first terminal provided with a first biasing voltage and a second terminal provided with a second biasing voltage from said source;
    a transistor between said input and output circuits having a base connected to said first terminal, an emitter connected to said second terminal and a floating collector disconnected from said source, the connection between said emitter and said second terminal including a resistor, the relative polarities of said first and second biasing voltages being such as to drive a base current sufficient to saturate said transistor in the absence of said carrier, said circuit means deriving from the amplitude modulation of said carrier a train of unipolar pulsations superimposed upon said first biasing voltage with a polarity such as to reduce the potential difference between said base and said emitter, said transistor forming a low-impedance path between said emitter and said collector in its saturated state for the passage of limited-amplitude pulsations including said signal pulses but blocking the transmission of pulsations from said base to said collector in the presence of large-amplitude noise pulses reducing said potential difference to substantially zero; and
    a load terminal in said output stage capacitively coupled to said collector.

2. A noise suppressor as defined in claim 1, further comprising a shunt capacitor connected between said collector and a terminal of said source.

3. A noise suppressor as defined in claim 1 wherein said input and output circuits comprise an intermediate-frequency stage and an audio stage, respectively.

4. A noise suppressor as defined in claim 1 wherein said circuit means comprises a capacitive branch connected to a terminal of said source, a resistive branch in parallel with said capacitive branch, and a diode in series with both branches, said first terminal being connected to said branches via said diode.

5. A noise suppressor as defined in claim 4, further comprising a shunt capacitor connected between said collector and said terminal of said source.

6. A noise suppressor as defined in claim 4, further comprising a bypass capacitor connected across a part of said resistive branch between said second terminal and said terminal of said source.

7. A noise suppressor as defined in claim 4 wherein said resistive branch comprises a voltage divider, said second terminal being a tap on said voltage divider.

8. A noise suppressor as defined in claim 7 wherein said circuit means further comprises a low-pass filter including a series inductance between said diode and said first terminal and a shunt capacitance between said first terminal and said terminal of said source.

9. A noise suppressor as defined in claim 7 further comprising gain-control means for said receiver including comparison means with input connections to said emitter and to a point on said voltage divider.

10. A noise suppressor as defined in claim 9 wherein said point on said voltage divider lies substantially midway between said diode and said tap.

* * * * *